United States Patent [19]

Arlt et al.

[11] 4,397,695
[45] Aug. 9, 1983

[54] METHOD FOR STABILIZING THE CURRENT GAIN OF NPN -SILICON TRANSISTORS

[75] Inventors: Manfred Arlt, Krailling; Joachim Dathe, Munich, both of Fed. Rep. of Germany

[73] Assignee: Siemens Aktiengesellschaft, Berlin and Munich, Fed. Rep. of Germany

[21] Appl. No.: 269,740

[22] Filed: Jun. 2, 1981

[30] Foreign Application Priority Data

Jun. 4, 1980 [DE] Fed. Rep. of Germany ....... 3021215

[51] Int. Cl.³ .................... H01L 7/54; H01L 21/265
[52] U.S. Cl. ...................... 148/1.5; 29/575; 29/590; 148/187; 357/34; 357/91
[58] Field of Search .............. 148/1.5, 187; 29/575, 29/590; 357/34, 91

[56] References Cited

U.S. PATENT DOCUMENTS

| 3,615,873 | 1/1971 | Sluss, Jr. et al. ...................... 148/1.5 |
| 3,880,676 | 4/1975 | Douglas et al. ........................ 148/1.5 |
| 4,151,007 | 4/1979 | Levinstein et al. .................. 148/1.5 |
| 4,167,425 | 9/1979 | Herbst .................................. 148/1.5 |

OTHER PUBLICATIONS

Koji, T. IEEE—Trans. Electron Devices, vol. ED-23 (1976) 1103–1104.

*Primary Examiner*—Upendra Roy
*Attorney, Agent, or Firm*—Herbert L. Lerner; Laurence A. Greenberg

[57] ABSTRACT

Stabilizing the current gain of NPN-silicon transistors by two annealing processes:
- a high temperature annealing process for at least 30 minutes at a temperature of 510° to 590° C., and
- a lower temperature annealing process for at least 30 minutes at a temperature of 380° to 460° C.

13 Claims, 6 Drawing Figures

METHOD FOR STABILIZING THE CURRENT GAIN OF NPN -SILICON TRANSISTORS

BACKGROUND OF THE INVENTION

1. Field of the Invention

The invention relates to a method for stabilizing the current gain of NPN-transistors.

2. Description of the Prior Art

The degradation of the current gain B, i.e. the ratio of collector current to base current of bipolar transistors is a known problem in semiconductor technology. From IEEE Trans. Electron Devices, Vol. ED 18, No. 8, Aug. 1971, Pages 570 to 573, it is known that a drop of the current gain can be caused not only by mobile ions in the oxide or avalanching the emitter-base diode, but also by reverse temperature stress, called in the following HTRB (High-Temperature-Reverse-Bias). In a considerable percentage of all NPN transistors, HTRB stress results in a linear drop of the current gain, i.e. a drop which is constant over a major range of the collector current. This degradation of the current gain is also called B-drift. This B-drift can be healed by heating under high-current breakthrough load or by annealing without applied reverse voltage, i.e. the original current gain prior to the HTRB is obtained again.

FIG. 1 shows a cross-section through a NPN-planar-transistor to which the process according to the invention is applied. The transistor consists of a n+-conducting substrate 5, thereupon an n-conducting collector zone 4, a therein arranged p-conducting base-zone 3, and an also therein arranged n-conducting emitter-zone 2. The emitter zone 2 is contacted by the emitter contact 7. The base-zone 3 is contacted by the base contact 8. The parts of the semiconductor surface 6 which are not covered by the metal contacts are covered by an insulating layer 9. Emitter and base contacts are so constructed that they lie on tope of parts of the insulating layer 9. The dash-lines 10 and 11 indicate the borders of a space-charge zone at the base-collector junction (transition). The width of the space-charge zone depends on potential between collector and base, $U_{CB}$. At $U_{CB}=40$ V, a width of the space-charge zone results as shown by the lines 10 and 11 in the drawing shown in the scale of the drawing. The dash-lines 12 and 13 indicate the width of the space charge zone at the pn-junction between emitter and base. The width of this space charge zone depends on the potential between emitter and base, which in the case of the lines 12, 13 shown in the drawing is 4 volts.

The contact arrangement of the collector is not shown in the drawing. It can either be made on the backside of the substrate, or n+-doped substrate connector-layers can be arranged in the semiconductor chip, so that they reach the semiconductor surface 6, and make the contacting of the collector possible on the surface 6. A forward current stress of the emitter-base diode of transistors "drifted" in this manner leads to a further change in the current gain, the so-called B-elevator effect. The current gain change caused by this effect is non-linear, the transistors show an unstable family of output characteristics on a curve-tracer. Characteristic is a current-gain degradation at small collector currents and a current-gain increase for large collector currents. The B-elevator effect can be initiated not only by HTRB stress, but can also occur, for instance, without electrical stress, as investigations of our own have shown.

SUMMARY OF THE INVENTION

It is an object of the present invention to provide a method in the manufacture of the transistor through which it is ensured that no current gain changes occur during the later operation of the transistors, or that occurring current gain changes are reduced substantially.

With the foregoing and other objects in view, there is provided in accordance with the invention a method for stabilizing the current gain of NPN-silicon transistors, after high-temperature processes necessary for manufacturing the transistors have been completed, comprising annealing the transistors for at least 30 minutes at a temperature of 510° to 590° C. and for at least 30 minutes at a temperature of 380° to 460° C.

Other features which are considered as characteristic for the invention are set forth in the appended claims.

Although the invention is illustrated and described herein as embodied in a method for stabilizing the current gain of NPN-silicon transistors, it is nevertheless not intended to be limited to the details shown, since various modifications may be made therein without departing from the spirit of the invention and within the scope and range of equivalents of the claims.

The invention, however, together with additional objects and advantages thereof will be best understood from the following description.

DETAILED DESCRIPTION OF THE INVENTION

Figure 1:
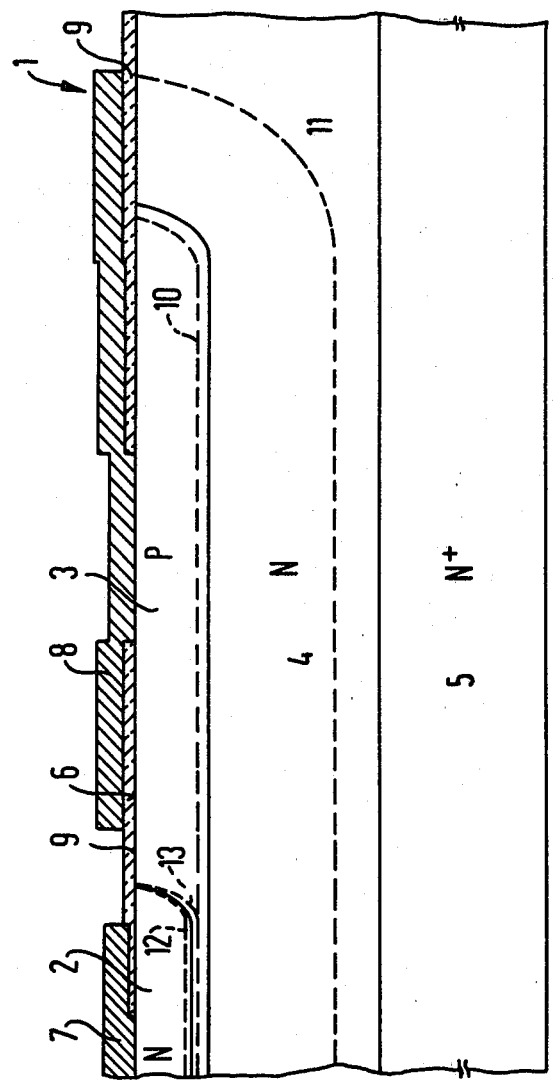
FIG. 1 illustrates a NPN-planar-transistor in a cross-sectional view, to which the process of the invention is applied.

In accordance with the invention, the transistors are annealed, after the high-temperature processes necessary for the manufacture are completed, for at least 30 minutes at a temperature of 510° to 590° C. and at least 30 minutes at a temperature of 380° to 460° C. Such a two-stage annealing procedure makes it possible for the annealed transistors to have a stable current gain under electrical stress.

Preferably, the annealing process with the higher temperature is carried out first. Advantageously, the annealing process with the higher temperature is carried out at 530° to 570° C. for at least 60 minutes, while the annealing process with the lower temperature is advantageously carried out at 420° to 450° C. for at least 2 hours.

It is within the scope of the invention that the annealing process with the higher temperature is carried out prior to the metallization of the transistors, and the annealing process with the lower temperature is carried out after or simultaneously with, the metallization sintering of the transistors, and that at least one annealing process is carried out in a nitrogen-hydrogen atmosphere.

The current gain of NPN transistors can drop by HTRB stress at 275° C., for instance after two hours, up to 85% of the original value in the collector current range of 10 μA to 50 mA. This B-drift is approximately linear, i.e. independent of the magnitude of the collector current. It is most pronounced with HTRB and the emitter-base and the collector-base diodes blocked, while the effect is smaller if the emitter-base diode is cut off and the collector-base diode is short-circuited. With the emitter-base diode short-circuited and the collector-base diode cut off, there is no B-drift.

While in the above-cited literature reference, the B-drift is explained as a bulk effect, the real cause in the silicon volume could not be determined. There is also no information as to how such an effect might be prevented.

Our own investigations suggest that the B-drift is caused by diffusion of electrically active "species" in the electric field of the space charge zone, where the concentration of the "species" can be influenced by the wafer or epitaxial layer manufacturing process and/or by other technological processes. Such "species" may be, for instance, an oxygen-silicon, nitrogen-silicon, or carbon-silicon compound (for instance $SiO_2$, $SiO_4$, $SiN_2$, SiC) or several of these compounds. The need for annealing steps at different temperatures indicates the presence of at least two different "species". By these stabilizing anneals, the concentration or mobility of the "species" is apparently influenced so that the B-drift disappears.

In PNP transistors, no B-drift has been observed so far. The reason could be the reversed field direction in the cut-off stress of the diodes, which prevents the assumed field diffusion, so that a corresponding effect of this kind might be present, but does not become electrically active.

The B-avalanche effect in transistor drifted after HTRB stress, shows an unstable family of output characteristics, caused by forward bias stress of the emitter-base diode. Characteristic for this B-elevator effect is the current-gain degradation for small collector currents and a current-gain increase for large collector currents. For forward-current stress of the collector-base diode with the emitter-base diode open, quantitatively the same B-avalanche effect is obtained as with stress of the emitter-base diode with the collector-base diode open. If, however, the unloaded diode is short-circuited, only a slight B-avalanche effect occurs. From current path considerations it can, therefore, be concluded that the current flowing laterally in the area of the base causes the B-elevator effect.

In the following, the formation of the B-avalanche effect is further explained with the aid of FIGS. 2–6. FIGS. 2–6 show NPN-planar transistors similar to FIG. 1, in which the current pathways are illustrated. The line thicknesses of the various current pathways indicate the current strength of the electric currents. Elements already described in FIG. 1 are indicated in FIGS. 2–6 with the same reference symbols, and are not described again. With respect to FIG. 1, the FIGS. 2–6 are simplified, because a n+-doped substrate zone is omitted in connection with the n-doped collector zone 4, and the collector contact 14 is arranged as a backside contact at the n-doped collector zone 4.

Figure 2:
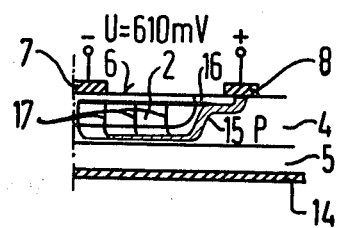
FIGS. 2–6 show NPN-planar-transistors similar to FIG. 1, in which the current pathways are illustrated by lines and the thicknesses of the lines indicate the current strength.

In FIG. 2, a direct voltage of 610 mV is applied between the emitter contact 7 and the base contact 8, in a way that the negative pole, indicated by the minus sign, is at the emitter contact 7, and the positive connection, indicated by the plus sign, is at the base contact 8. The collector contact 14 is thereby open.

In this circuit arrangement, a strong lateral current flow within the base zone 4, indicated by current path 15, which leads from base contact 8 to the emitter contact 7. Furthermore, a second weaker current indicated by current path 16 flows from the base contact 8 to the emitter contact 7 directly under the semiconductor surface 6. Furthermore, the current pathways 17 run perpendicular to the semiconductor surface 6 between the lateral current pathways 15 and 16.

Figure 3:
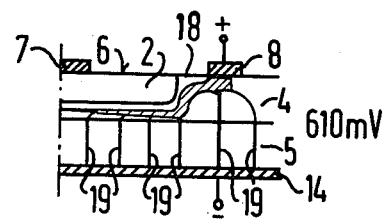

FIG. 3 shows a transistor according to FIG. 2, wherein a potential of 610 mV is applied between collector contact 14 and the base contact 8, so that the negative pole of the direct voltage lies at the collector contact 14, while the positive pole lies at the base contact 8. The emitter contact 7 is open in this arrangement. In this case, a strong current path 18 is formed, which flows mainly lateral within the base zone 4. Furthermore, a great number of current pathways 19 are formed, which mainly run perpendicularly to the semiconductor surface 6, and which connect the base contact 8, respectively, the current path 18 with the collector contact 14.

Figure 4:
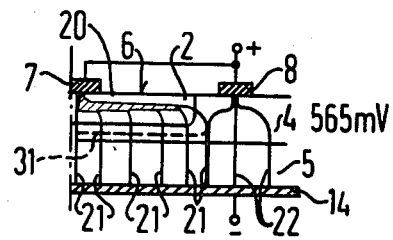

In FIG. 4 a transistor similar to FIG. 2 is shown, in which the emitter contact 7 and the base contact 8 are short circuited, and whereby a potential 565 mV is applied, so that the negative pole lies at the collector contact 14, while the positive pole lies at the base contact 8. In this arrangement, a strong lateral current path 20 forms within the emitter zone 2, which branches to form a great number of current pathways 21 running perpendicularly to the semiconductor surface 6, which lead to the collector contact 14. Additional current pathways 22 lead from the base contact 8 to the collector contact 14 running essentially perpendicularly. Also there is a weak lateral current path 31 shown by a dash-line within the base zone 3.

Figure 5:
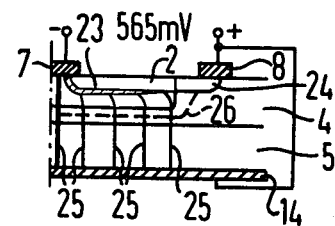

FIG. 5 shows a transistor as in FIG. 2, wherein the collector contact 14 and the base contact 8 are short circuited, and a direct voltage of 565 mV is connected between the emitter contact 7 and the base contact 8, such that the negative pole of the direct voltage lies at the emitter contact 7, and the positive pole of the direct voltage lies at the base contact 8. In this transistor wiring scheme there is a strong lateral current path 23 within the emitter zone 2, which is produced by a weak lateral current path 24 in the base zone 4, and a number of current pathways 25 which connect the collector contact 14 and the current path 23. Additionally, there is a weak current path 26 in the base zone 3, indicated by the dash-line.

Figure 6:
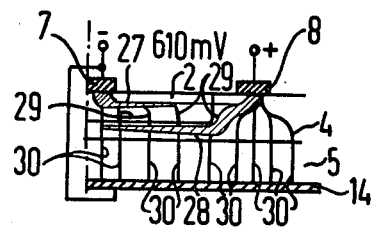

In FIG. 6, a transistor similar to the one in FIG. 2 is shown in which the collector contact 14 and the emitter contact 7 are short circuited. A direct voltage of 610 mV is applied between the emitter contact 7 and the base contact 8, whereby the negative pole of the potential lies at the emitter contact 7, while the positive pole lies at the base contact 8. In this arrangement, there is a strong lateral current path 28 in the base zone 3, which is connected with the collector contact 14 by numerous current pathways 30 which run perpendicularly to the semiconductor surface 6, and which is also connected to a second, strong current path 27 in the emitter zone by means of current paths 29 which run perpendicularly to the semiconductor surface 6.

FIGS. 2, 3 and 6 show strong lateral current pathways inside of the base zone 3; also at the same time, a strong B-avalanche effect occurs in the wiring arrangement according to FIGS. 2, 3 and 6.

After the flux current is switched off, a relaxation takes place so that after a finite time, the base current change caused by the B-elevator effect is completely healed. The healing time depends strongly on the temperatures; at room temperature, it takes approximately five hours until the recombination current disappears completely, with a collector current of 10 μA.

Like the B-drift, the B-elevator effect also can be made to disappear by the two-stage anneal according to the invention, since both effects obviously have the same thermal activation energy. Advantageously, the annealing processes are carried out on the silicon wafers before they are diced. Carrying out only one annealing process shows only little stabilization of the current gain. The duration of the annealing processes should not be less than 30 minutes, since otherwise the stabilizing effect obtained may be too small.

Through a two-stage stabilizing anneal of 75 minutes at 550° C. and 120 minutes and 420° C., the B-drift could no longer be detected after 1,000 hours, 175° C., $U_{CB}=30$ V, $U_{EB}=4$ V. (Change factor of the current gain B after HTR prior to HTRB=0.97 ... 1.03). Without stabilizing anneal, transistors had change factors of 0.5 ... 0.7 with the same stress.

The B-elevator effect, which led to a B-change factor of 0.5 with $I_C=10$ μA, was likewise reduced by the above-mentioned annealing processes to 0.97 ... 1.0.

The minimum annealing time is determined by the respective concentration of the electrically active species in the silicon bulk; the upper limit of the annealing time is substantially given only by economic considerations. While the high-temperature annealing process is carried out normally prior to the metallization of the components, the annealing process with the lower temperature can be carried out after or also simultaneously with, the metallization-sintering, for instance an aluminum metallization. Thus, it is possible to save one process step. In principle, the surface state of the wafers to be annealed, for instance metallization or passivation, is not critical, since pure bulk annealing effects are involved. The same is true for the atmosphere in which the annealing processes are carried out. It may, however, be advantageous to use a nitrogen-hydrogen atmosphere, for instance, gas consisting of nitrogen and 10% hydrogen, since this is of advantage for the surface properties of the transistors.

We claim:

1. Method for stabilizing the current gain of NPN-silicon transistors after high-temperature processes necessary for manufacturing the transistors have been completed, comprising first annealing the transistors for at least 30 minutes at a temperature of 510° to 590° C. and then for at least 30 minutes at a temperature of 380° to 460° C.

2. Method according to claim 1, wherein the annealing process at the higher temperature is carried out at 530° to 570° C.

3. Method according to claim 1, wherein the annealing process at the higher temperature is carried out for at least 60 minutes.

4. Method according to claim 1, wherein the annealing process at the lower temperature is carried out at 420° to 450° C.

5. Method according to claim 1, wherein the annealing process at the lower temperature is carried out for at least two hours.

6. Method according to claim 1, wherein at least one annealing process is carried out in a nitrogen-hydrogen atmosphere.

7. Method according to claim 2, wherein the annealing process at the higher temperature is carried out for at least 60 minutes.

8. Method according to claim 2, wherein the annealing process at the lower temperature is carried out at 420° to 450° C.

9. Method according to claim 3, wherein the annealing process at the lower temperature is carried out at 420° to 450° C.

10. Method according to claim 7, wherein the annealing process at the lower temperature is carried out at 420° to 450° C.

11. Method according to claim 3, wherein the annealing process at the lower temperature is carried out for at least two hours.

12. Method according to claim 4, wherein the annealing process at the lower temperature is carried out for at least two hours.

13. Method according to claim 1 or claim 3 or claim 4 or claim 5, wherein the annealing process at the higher temperature is carried out prior to effecting a metallization of the transistors by sintering, and the annealing process at the lower temperature is carried after or simultaneously with, the metallization sintering of the transistors.

* * * * *